United States Patent [19]

Okonogi et al.

[11] Patent Number: 5,210,379
[45] Date of Patent: May 11, 1993

[54] PRINTED WIRING BOARD WITH ELECTROMAGNETIC WAVE SHIELDING LAYER

[75] Inventors: Hirotaka Okonogi; Katsutomo Nikaido; Junichi Ichikawa, all of Miyoshi, Japan

[73] Assignee: Nippon CMK Corp., Japan

[21] Appl. No.: 841,195

[22] Filed: Feb. 24, 1992

Related U.S. Application Data

[63] Continuation of Ser. No. 657,453, Feb. 19, 1991.

[30] Foreign Application Priority Data

Apr. 18, 1990 [JP] Japan .................................. 2-102147

[51] Int. Cl.⁵ ............................................ H05K 01/00
[52] U.S. Cl. ...................................... 174/264; 29/837; 361/400
[58] Field of Search ............... 174/250, 254, 260, 262, 174/264; 29/831, 837, 842, 400; 361/401

[56] References Cited

U.S. PATENT DOCUMENTS

| | | | |
|---|---|---|---|
| 4,789,760 | 12/1988 | Koyama | 174/264 |
| 4,801,489 | 1/1989 | Nakagawa | 174/264 |
| 5,030,800 | 7/1991 | Kawakami | 174/260 |
| 5,043,526 | 8/1991 | Nakagawa | 174/250 |

Primary Examiner—Leo P. Picard
Assistant Examiner—Trinidad Korka
Attorney, Agent, or Firm—Bruce L. Adams; Van C. Wilks

[57] ABSTRACT

A printed wiring board has an electromagnetic wave shielding layer. The printed wiring board includes a printed circuit formed on a substrate. Stratified layers of insulation are formed over the printed circuit. The insulation layers are disposed so as to form a bowl-shaped connection region. A terminal may be formed simultaneously with the forming of the electromagnetic wave shielding layer to provide a connection between the electromagnetic shielding layer and the printed circuit. The bowl-shaped connecting region provides for smoothly filling the terminal with a conductor paste without the occurrence of foaming or blurring during, for example, a silk screening printing process.

11 Claims, 1 Drawing Sheet

5,210,379

PRINTED WIRING BOARD WITH ELECTROMAGNETIC WAVE SHIELDING LAYER

This is a continuation application of parent application Ser. No. 657,453 filed Feb. 19, 1991.

BACKGROUND OF THE INVENTION

1. Field of the Invention

The present invention relates to a printed wiring board which is provided with an electromagnetic wave shielding layer.

2. Description of the Prior Art

Conventionally, in order to prevent circuits from malfunctioning due to electromagnetic waves present between printed wiring boards or between external apparatuses, an electromagnetic wave shielding layer is provided on these printed circuits across an insulative layer.

Normally, connection between the electromagnetic wave shielding layer 6 and a grounding circuit 4 of a printed circuit of a conventional printed wiring board 7 is accomplished by the following steps: First, as shown in FIG. 2, an insulative layer 3 is provided on a printed circuit 2. A terminal 5 is formed on the grounding terminal 4 having an aperture equal to that of the grounding terminal 4. After the formation of the terminal 5 the electromagnetic wave shielding layer 6 is formed on the insulative layer 3 in order to electrically connect the electromagnetic wave shielding layer 6 to the grounding terminal 4 before electrically connecting the electromagnetic wave shielding layer 6 to the printed circuit via the terminal 5.

SUMMARY OF THE INVENTION

When manufacturing the printed wiring board 7 in accordance with the sequence mentioned above, connection between the electromagnetic wave shielding layer 6 and the grounding terminal 4 is accomplished via the terminal 5 which is produced simultaneous with the formation of the electromagnetic wave shielding layer 6. However, conventionally, the electromagnetic wave shielding layer 6 is formed by coating a conductive paste by a silk printing process. This in turn causes the terminal 5 to become faulty in the electrical connection and unstable in performance.

More particularly the, available recess area of the terminal 5 between the insulative layer 3 formed on the printed circuit 2 and the grounding terminal 4 is extremely constrained relative to the growing density of the printed circuits. In consequence, the conductive paste cannot smoothly enter into the terminal 5 in the course of coating the paste during the forming of the electromagnetic wave shielding layer 6. Also, the conductive paste is likely to generate foam. In addition, the conductive paste is prevented from smoothly entering into the terminal 5 due to presence of the edge of the aperture, thus causing the connection of the terminal 5 to be unstable.

The object of the invention is to fully solve those problems mentioned above present in conventional printed wiring boards having the electromagnetic wave shielding layer by offering a novel printed wiring board that can be manufactured with a consistently stable connection between the electromagnetic wave shielding layer and the grounding terminal.

MEANS FOR SOLVING PROBLEMS AND FUNCTIONAL OPERATION

The printed wiring board embodied by the invention is characterized by the formation of an electromagnetic wave shielding layer on a printed circuit formed on one-side surface or both surfaces of the substrate across insulative layers in conjunction with the electrical connection of the electromagnetic wave shielding layer and the grounding circuit of the printed circuit via a bowl-shaped terminal.

Since the invention provides a bowl-shaped terminal for connection between the electromagnetic wave shielding layer and the grounding circuit of the printed wiring board conductive paste can securely be filled in the terminal by means of coating during the formation of the electromagnetic wave shielding layer, and yet, the method embodied by the invention prevents the occurrence of foam or "blur" phenomenon during the paste filling process.

DESCRIPTION OF THE EMBODIMENTS

Figure 1:
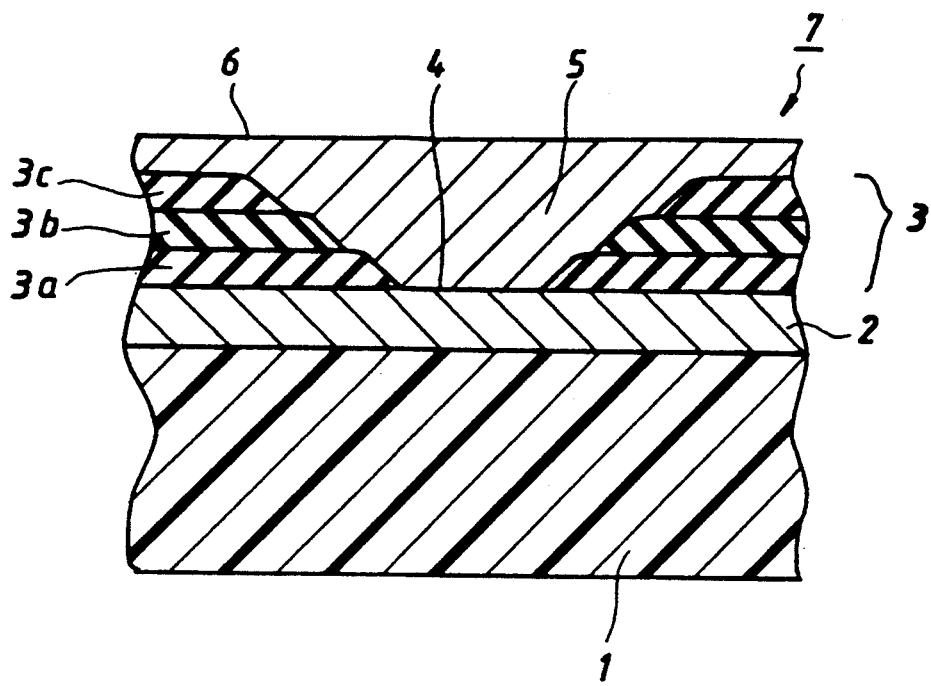
FIG. 1 shows a sectional view of essential components of the printed wiring board according to an embodiment of the invention.
Figure 2:
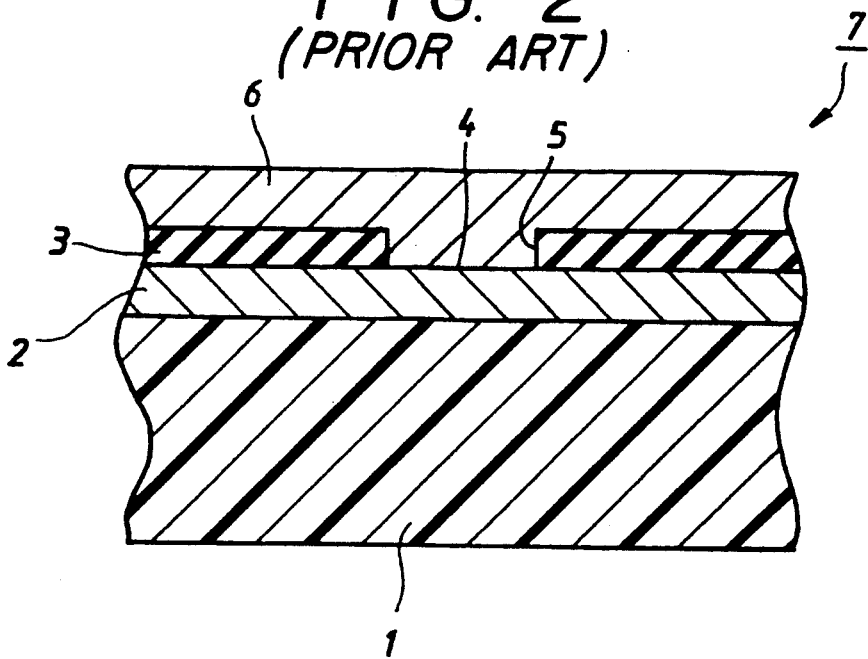
FIG. 2 shows a sectional view of a conventional terminal.

Referring to FIG. 1, the structure of the printed wiring board according to an embodiment of the invention is described below. FIG. 1 presents a sectional view of essential components of the printed wiring board embodied by the invention.

The printed wiring board 7 shown in FIG. 1 in accordance with an embodiment of the invention is manufactured by executing the following steps; formation of a printed circuit 2 containing the predetermined pattern on a substrate 1, followed by formation of insulative layers 3 (hereinafter called "under resist") on the printed circuit 2, and the final formation of an electromagnetic wave shielding layer 6 on the under resist 3.

The electromagnetic wave shielding layer 6 and the grounding terminal 4 of the printed circuit 2 are conjunctionally structured by means of electrical connection via the terminal 5. In other words, the electrical connection between the electromagnetic wave shielding layer 6 and the terminal 5 is accomplished by the formation of the terminal 5 by providing an aperture for the terminal 5 during the formation of the under resist 3 and the terminal 5 after completing the process for filling up the aperture of the terminal 5 with conductive paste used for the electromagnetic wave shielding layer 6.

The under resist 3 is provided by sequentially stratifying three layers including under resists 3a, 3b and 3c. When shaping up each layer of these under resists 3a through 3c, the diameter of the aperture of the terminal 5 provided on the grounding circuit 4 of the printed circuit 2 is arranged in order that the diameters gradually expand from the bottom under resist 3a right above the printed circuit 2 to the top under resist 3c right below the electromagnetic wave shielding layer 6 against the diameter of the grounding terminal 4 (see FIG. 1). For example, it is so arranged that the aperture diameter of the bottom under resist 3a is equal to the diameter of the grounding terminal 4, whereas the aperture diameter of the middle under resist 3b is wider than that of the bottom under resist 3a by 0.2 millimeter, and further, the aperture diameter of the top under resist 3c is wider than that of the middle under resist 3b by 0.2 millimeter, respectively. In this way, the terminal 5 formed by way of a bowl-like recess aperture is formed on the grounding terminal 4 this bowl-like recess aperture forms a bowl-shaped connecting region which has a bottom defined by the printed circuit 2 and sides that are inwardly sloping towards the bottom.

FIG. 1 illustrates the sectional structure in which stepwise difference is provided for each aperture of these under resists 3a through 3c. However, it is also possible for the invention to provide such a bowl-like recess consisting of a stepless continuous incline surface along the aperture. Furthermore, it is also possible for the invention to embody stratified under resist by forming two layer or more than three layers without solely confining the number of layer to three units.

These under resist layers 3a through 3c can also be formed by any conventional method such as, for example, silk printing.

The electromagnetic wave shielding layer 6 is formed by coating the top region of the under resist 3c with thermosetting conductive paste by applying a silk printing process or the like.

After completing the coating of conductive paste and subsequent curing process, the electromagnetic wave shielding layer 6 needed for the printed circuit 2 of the printed wiring board 7 is thus completed. During the process of coating the conductive paste, the aperture of the terminal 5 is formed by means of a curing process to provide the electrical connection between the electromagnetic wave shielding layer 6 and the grounding terminal 4. Thus, the terminal 5 connected with the grounding terminal 4 are formed by filling a conductive paste comprising the electromagnetic wave shielding layer 6 into the bowl-shaped connecting region.

In particular, since the aperture is formed in a bowl-like shape, even when the aperture area is limited, the conductive paste can smoothly enter into the entire aperture space, and as a result, shortage of the conductive paste, foam, or "blur" phenomenon, can be prevented. In other words, the inwardly sloping sides of the bowl-shaped connecting region are effective to facilitate entry of the conductive paste into the bowl-shaped connecting region.

The above description has merely referred to an embodiment of the printed wiring board which is provided on a single surface. However, the invention can also effectively be applied to both sides of the printed wiring board or to multi-layer printed wiring board as well.

ADVANTAGEOUS EFFECT OF THE INVENTION

According to the printed wiring board embodied by the invention, the electromagnetic wave shielding layer can be stably connected to the grounding terminal. Therefore, overall quality of the printed wiring board can be consistent. Furthermore, precision and durability of all the related products can be attained.

What is claimed is:

1. A printed wiring board comprising:
   an electromagnetic wave shielding layer formed on a printed circuit on at least one surface of a substrate over a plurality of successively formed insulative layers having increasingly larger apertures defining a bowl-shaped opening, the bowl-shaped opening having a bottom defined by the printed circuit and sides inwardly sloping towards the bottom; and
   a grounding circuit electrically connected to said electromagnetic wave shielding layer and printed circuit by a bowl-shaped connecting region formed in the bowl-shaped opening by filling a conductive paste comprising the electromagnetic wave shielding layer into the bowl-shaped opening;
   whereby the inwardly sloping sides are effective to facilitate entry of the conductive past into the bowl-shaped opening during the formation of the bowl-shaped connecting region.

2. A printed wiring board according to claim 1, wherein said insulating layers are composed of at least three insulative layers.

3. A printed wiring board according to claim 1, wherein diameters of apertures of respective insulating layers differ from each other by 0.2 millimeter.

4. A printed wiring board comprising:
   a substrate;
   a printed circuit layer formed on at least one surface of the substrate;
   a series of insulative layers formed successively one over the other on the printed circuit layer with increasingly larger apertures defining at least one bowl-shaped connecting region, each bowl-shaped connecting region having a bottom defined by the printed circuit layer and sides inwardly sloping towards the bottom whereby the inwardly sloping sides are effective to facilitate entry of conductive paste into the bowl-shaped connecting region during formation of bowl-shaped terminal portions; and
   an electromagnetic wave shielding layer formed on the insulative layers and having bowl-shaped terminal portions formed by filling a conductive paste which comprises the electromagnetic wave shielding layer into each bowl-shaped connecting region so as to form the bowl-shaped terminal portions.

5. A printed wiring board according to claim 4; wherein the series comprises at least two successively formed individual insulating layers.

6. A printed wiring board according to claim 5; wherein each successively formed individual insulating layer defines an aperture having a diameter larger than a diameter of an aperture defined by a next previously formed individual insulating layer, and said apertures define the bowl-shaped connecting region.

7. A printed wiring board according to claim 6; wherein each aperture has a diameter 0.2 millimeters larger than a next previously defined aperture.

8. A method of manufacturing a printed wiring board comprising the steps of: providing a substrate; forming a printed circuit layer on at least one surface of the substrate; successively forming a series of insulative layers on the printed circuit layer with the successive layers having increasingly larger apertures which jointly define at least one bowl-shaped connecting region, each bowl-shaped connecting region having a bottom defined by the printed circuit layer and sides inwardly sloping towards the bottom whereby the inwardly sloping sides are effective to facilitate entry of conductive paste into the bowl-shaped connecting region during subsequent formation of a bowl-shaped terminal portion; and forming an electromagnetic wave shielding layer on the electromagnetic wave shielding layer having a bowl-shaped terminal portion formed in the bowl-shaped connecting region by filling a conductive paste which comprises the electromagnetic wave shielding layer into the bowl-shaped connecting region so as to form the bowl-shaped terminal portion.

9. A method of manufacturing a printed wiring board according to claim 8; wherein the step of successively forming the series of insulative layers comprises forming at least two successively formed individual insulating layers.

10. A method of manufacturing a printed wiring board according to claim 9; wherein each successively formed individual insulating layer defines an aperture having a diameter larger than a diameter of an aperture defined by the next previously formed insulating layer, and said apertures define the bowl-shaped connecting region.

11. A method of manufacturing a printed wiring board according to claim 10; wherein each aperture has a diameter 0.2 millimeters larger than the next previously defined aperture.

* * * * *